(12) United States Patent
Chowdhury et al.

(10) Patent No.: US 6,990,438 B1
(45) Date of Patent: Jan. 24, 2006

(54) METHOD AND APPARATUS FOR OBSERVABILITY-BASED CODE COVERAGE

(75) Inventors: Debashis Roy Chowdhury, Acton, MA (US); Pallab Kumar Dasgupta, Andover, MA (US); Surrendra Amul Dudani, Watertown, MA (US); Ghassan Khoory, Wellesley, MA (US)

(73) Assignee: Synopsys, Inc., Mountain View, CA (US)

( * ) Notice: Subject to any disclaimer, the term of this patent is extended or adjusted under 35 U.S.C. 154(b) by 778 days.

(21) Appl. No.: 09/660,026

(22) Filed: Sep. 12, 2000

(51) Int. Cl.
*G06F 17/50* (2006.01)
(52) U.S. Cl. .............................. 703/13; 703/14; 703/15
(58) Field of Classification Search .................. 703/13, 703/14, 15
See application file for complete search history.

(56) References Cited

U.S. PATENT DOCUMENTS

| | | | | |
|---|---|---|---|---|
| 5,553,002 A | * | 9/1996 | Dangelo et al. | 716/11 |
| 5,600,579 A | * | 2/1997 | Steinmetz, Jr. | 364/578 |
| 5,724,504 A | * | 3/1998 | Aharon et al. | 395/183.09 |
| 5,740,086 A | * | 4/1998 | Komoto | 364/580 |
| 5,870,588 A | * | 2/1999 | Rompaey et al. | 395/500 |
| 6,053,947 A | * | 4/2000 | Parson | 703/14 |
| 6,141,630 A | * | 10/2000 | McNamara et al. | 703/14 |
| 6,173,241 B1 | * | 1/2001 | Trimberger | 703/13 |
| 6,484,134 B1 | * | 11/2002 | Hoskote | 703/14 |

OTHER PUBLICATIONS

Ho, R.C.; Han Yang, C.; Horowitz, M.A.; Dill, D.L., "Architecture validation for processors" Computer Architecture, 1995. Proceedings. 22nd Annual International Symposium on , Jun. 22-24, 1995 pp.: 404-413.*

Grinwald, R.; Harel, E.; Orgad, M.; Ur, S.; Ziv, A., "User defined coverage-a tool supported methodology for design verification" Design Automation Conference, 1998. Proceedings , Jun. 15-19, 1998 pp.: 158-163.*

Raghavan, R.; Baumgartner, J., "CoveT: a coverage tracker for collision events in system verification" Performance, Computing and Communications, 1998. IPCCC '98., IEEE International , Feb. 16-18, 1998 pp.: 172-177.*

Moundanos, D.; Abraham, J.A.; Hoskote, Y.V., "Abstraction techniques for validation coverage analysis and test generation" Computers, IEEE Transactions on , vol.: 47, Issue: 1 , Jan. 1998 pp.: 2-14.*

Dawson, C.; Pattanam, S.K.; Roberts, D., "The Verilog Procedural Interface for the Verilog Hardware Description Language" Verilog HDL Conference, 1996. Proceedings., 1996 IEEE International , Feb. 26-28, 1996 pp.: 17-23.*

(Continued)

*Primary Examiner*—Jean R. Homere
*Assistant Examiner*—Herng-der Day
(74) *Attorney, Agent, or Firm*—Jonathan T. Kaplan

(57) ABSTRACT

A technique for observability based coverage of a design under test (DUT) is presented. A conventional simulation signal is augmented to include a "tag value." In the course of a simulation, assignment statements (for which observability-based coverage is desired) "inject" tag values on their output signals. A tag value contains an identifier uniquely identifying the assignment statement that produced it. A tag value also contains a "tag history." The tag history contains copies of the tag values for assignment statements earlier in the flow of control or in the flow of data. If a tag propagated through the DUT appears at an observable output, the circuit designer knows that the assignment statements it identifies have satisfied observability based coverage.

21 Claims, 11 Drawing Sheets

OTHER PUBLICATIONS

The following web pages from TransEDA:☐☐http://web.archive.org/web/19990225100008/http://www.transeda.com/products/indexl.html ☐☐http://web.archive.org/web/19990127151441/http://www.transeda.com/products/vs_detail.html.* http://web.archive.org/web/19990420103520/http://www.transeda.com/products/vs_state.html ☐☐http://web.archive.org/web/19980702103732/http://www.transeda.com/products/vs_branch.html.* http://web.archive.org/web/19990420070435/http://www.transeda.com/products/vs_cond.html ☐☐http://web.archive.org/web/19990420101614/http://www.transeda.com/products/vs_path.html.* http://web.archive.org/web/19990420113203/http://www.transeda.com/products/vs_togg.html ☐☐http://web.archive.org/web/19990420092512/http://www.transeda.com/products/vs_gui.html.* http://web.archive.org/web/19990402122133/http://www.transeda.com/products/vs_trace.html.*

Devadas et al., "An Observability-Based Code Coverage Metric for Functional Simulation", IEEE/ACM International Conference on Computer-Aided Design, Nov., 1996, pp. 418-425.*

Fallah et al., "OCCOM: Efficient Computation of Observability-Based Code Coverage Metric for Functional Verification", Proceedings, Design Automation Conference, Jun. 1998, pp. 152-157.*

* cited by examiner

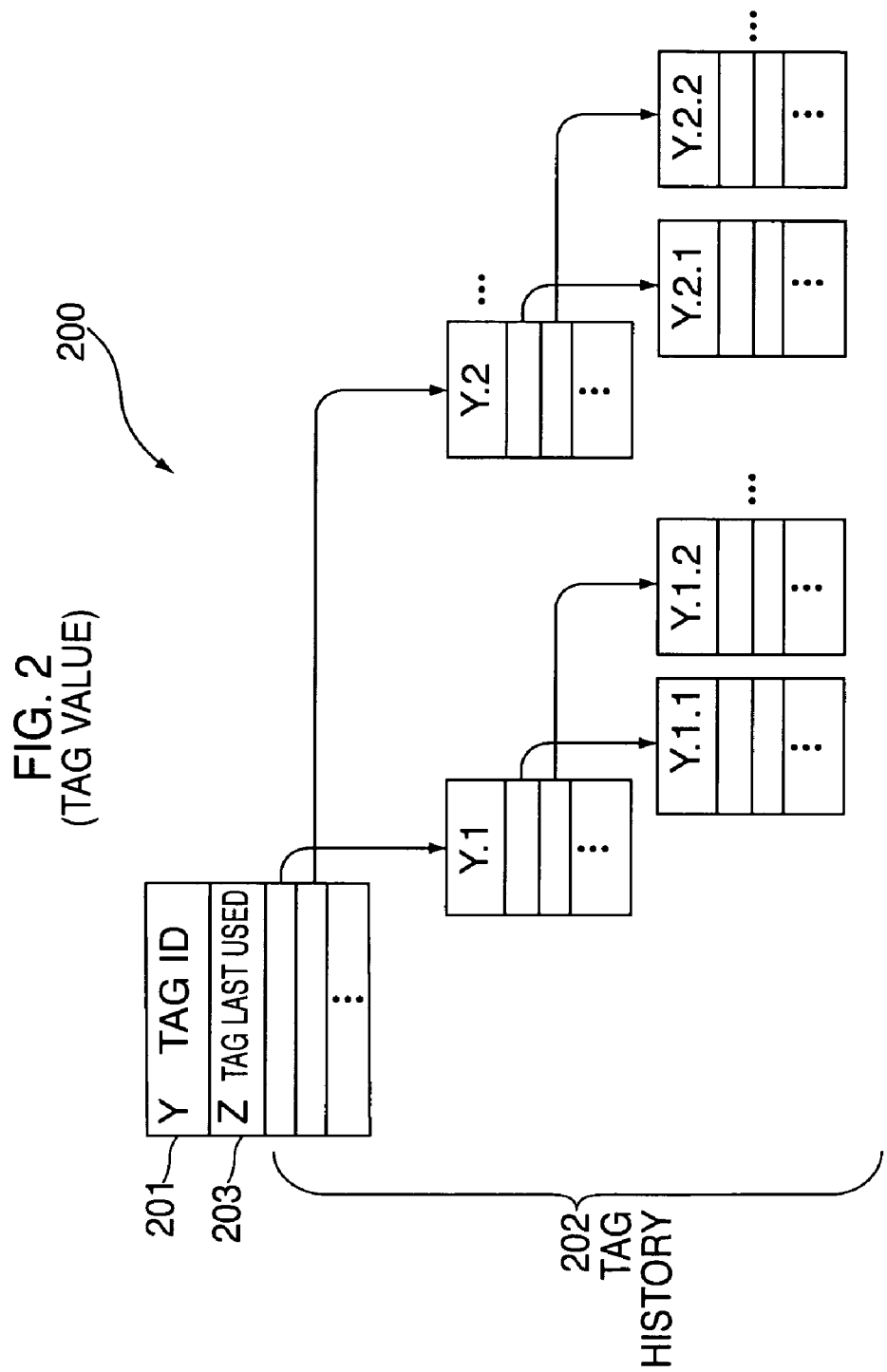

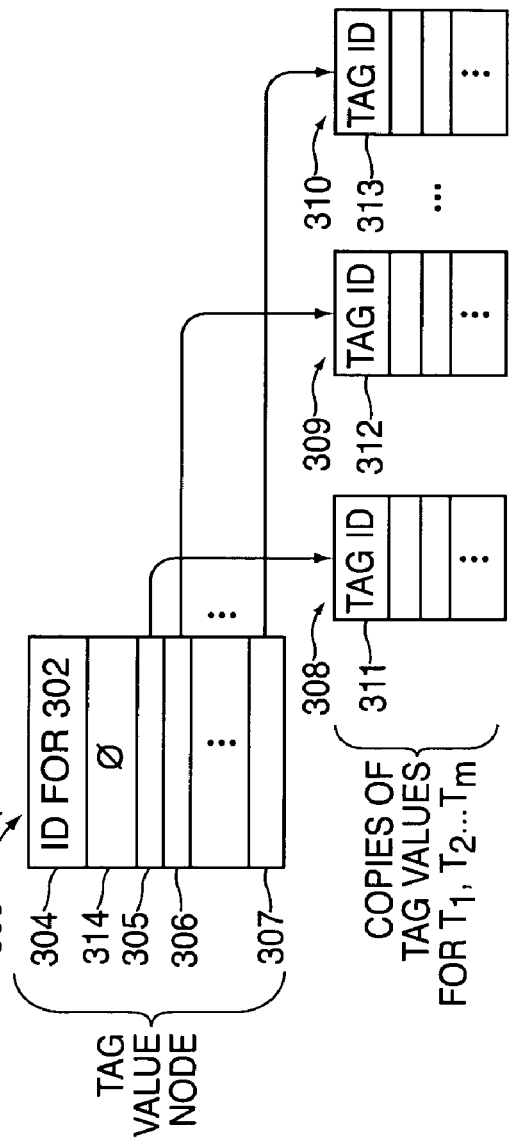

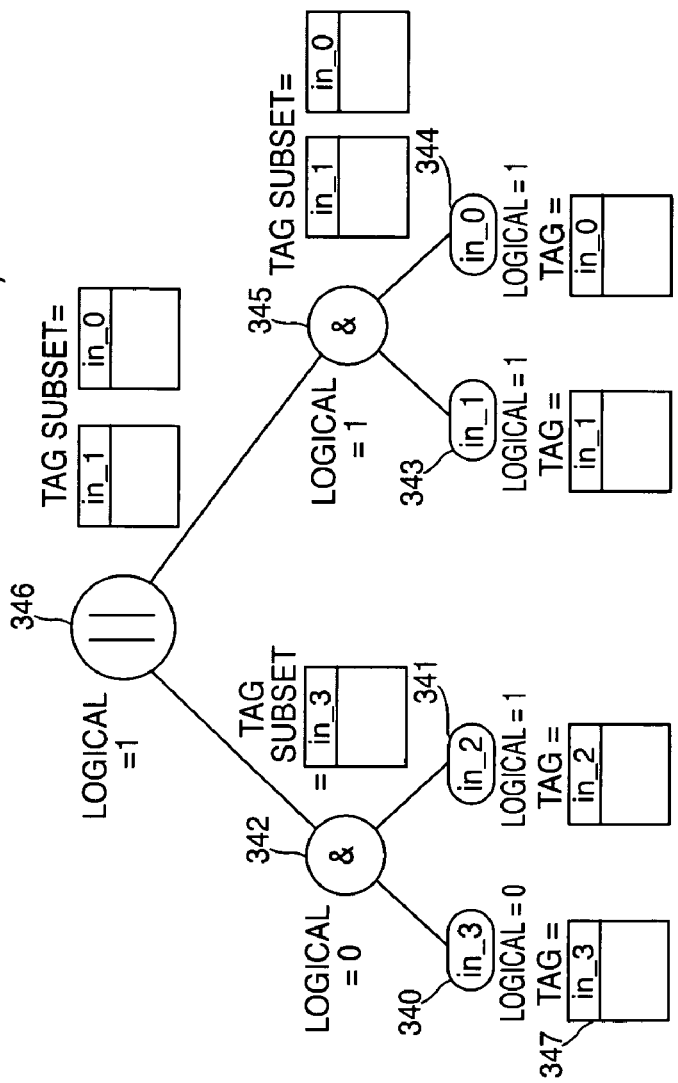

(RESULTING TAG VALUE FROM RULE-BASED PROPAGATION)

(ABSTRACTED CONDITIONALLY EXECUTED ASSIGNMENT)

if ($f_1(w_1, w_2, \ldots, w_t)$) ← 440
  if ($f_2(z_1, z_2, \ldots, z_p)$) ) ← 441
    out = $f(x_1, x_2, \ldots, x_n)$ ;
      ↑
   300  302

Figure 5A
(Verilog HDL program fragment with asynchronous assignments, an atomic block of synchronous assignments and conditionally executed assignments)

```
10      assign x = a & b;
20      assign y = a || c;

aways @(posedge clk)
        begin
30          e = a & d;
40          f = b || h;
            if ( a & (c || d) )
                if (x || y)
50                  e = f & g ;
                else
60                  e = f || g;
        end
```

Figure 5B
(instrumented Verilog HDL program fragment)

```
10      assign x = a & b;
20      assign y = a || c;

aways @(posedge clk)
        begin
30          $pli (30);
40          e = a & d;
50          f = b || h;
            if ( a & (c || d) )
                if (x || y)
                    begin
60                      $pli(60);
70                      e = f & g ;
                    end
                else
                    begin
80                      $pli(80);
90                      e = f || g;
                    end
        end
```

Figure 5C

Instrumented to Non-instrumented sub-file
- 10   10
- 20   20
- 30   40
- 40   50
- 50   70
- 60   90

Figure 5D

Expressions sub-file

PLI_call_instrumented_line_num 30
    assign_stmt_instrumented_line_num 40
    lhs_signal "e"
    rhs_expression "a & d"

PLI_call_instrumented_line_num 30
    assign_stmt_instrumented_line_num 50
    lhs_signal "f"
    rhs_expression "b || h"

PLI_call_instrumented_line_num 60
    assign_stmt_instrumented_line_num 70
    lhs_signal "e"
    rhs_expression "f & g", "a&(c||d)", "x||y"

PLI_call_instrumented_line_num 80
    assign_stmt_instrumented_line_num 90
    lhs_signal "e"
    rhs_expression "f || g", "a&(c||d)", "x||y"

PLI_call_instrumented_line_num 0
    assign_stmt_instrumented_line_num 10
    lhs_signal "x"
    rhs_expression "a&b"

PLI_call_instrumented_line_num 0
    assign_stmt_instrumented_line_num 20
    lhs_signal "y"
    rhs_expression "a || c"

Figure 5E parameter passed to callback function when signal "a" changes
    PLI_call_instrumented_line_num 0
    assign_stmt_instrumented_line_num 10
    lhs_signal "x"
    rhs_expression "a&b"

PLI_call_instrumented_line_num 0
    assign_stmt_instrumented_line_num 20
    lhs_signal "y"
    rhs_expression "a || c"

parameter passed to callback function when signal "b" changes
    PLI_call_instrumented_line_num 0
    assign_stmt_instrumented_line_num 10
    lhs_signal "x"
    rhs_expression "a&b"

parameter passed to callback function when signal "c" changes
    PLI_call_instrumented_line_num 0
    assign_stmt_instrumented_line_num 20
    lhs_signal "y"
    rhs_expression "a || c"

Figure 5F
(hierarchical Verilog HDL program fragment)

/* Higher-level module */
module higher_mod;

10          lower_mod lower_mod_inst(z, x, y & q)

endmodule

/* Lower-level modue */
module lower_mod (out1, in1, in2);

assign out1 = in1 || in2;

endmodule

Figure 5G

Expressions sub-file
    PLI_call_instrumented_line_num 0
    assign_stmt_instrumented_line_num 0
    lhs_signal "lower_mod_inst.in2"
    rhs_expression "y & q"

Figure 5H parameter passed to callback function when signal "y" changes
    PLI_call_instrumented_line_num 0
    assign_stmt_instrumented_line_num 0
    lhs_signal "lower_mod_inst.in2"
    rhs_expression "y & q"

parameter passed to callback function when signal "q" changes
    PLI_call_instrumented_line_num 0
    assign_stmt_instrumented_line_num 0
    lhs_signal "lower_mod_inst.in2"
    rhs_expression "y & q"

parameter passed to callback function when signal "x" changes
    PLI_call_instrumented_line_num 0
    assign_stmt_instrumented_line_num 0
    lhs_signal "lower_mod_inst.in1"
    rhs_expression "x"

parameter passed to callback function when signal "lower_mod_inst.out1" changes
    PLI_call_instrumented_line_num 0
    assign_stmt_instrumented_line_num 0
    lhs_signal "z"
    rhs_expression "lower_mod_inst.out1"

METHOD AND APPARATUS FOR OBSERVABILITY-BASED CODE COVERAGE

FIELD OF THE INVENTION

The present invention relates generally to determining the coverage of a code specification to which is applied a test stimulus, and more specifically to an observability-based approach to determining coverage.

BACKGROUND OF THE INVENTION

To tackle the increasing complexity of designing digital electronic circuits, designers often express their design in a high-level hardware description language (HLHDL) such as Verilog HDL. The HLHDL description is then converted into an actual circuit through a process, well known to those of ordinary skill in the art as "synthesis," involving translation and optimization. The detailed syntax and semantics of Verilog HDL is specified in the following publication that is herein incorporated by reference: "IEEE Standard Hardware Description Language Based on the Verilog Hardware Description Language," IEEE Standard 1364-1995, Institute of Electrical and Electronic Engineers, October 1996.

An HLHDL description can be verified by simulating the HLHDL description itself, without translating the HLHDL to a lower-level description. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. Such an HLHDL design, whose correctness is to be determined, shall be referred to as the "design under test" or DUT. In addition, simulation of the DUT can be accomplished much more quickly in an HLHDL than after the DUT has been translated into a lower-level, more circuit oriented, description.

Conventionally, such a DUT would be tested by simulating it and applying a test stimulus to the simulation. The test stimulus often consists of multiple "stimulus vectors," each stimulus vector being applied at a succeeding time increment. Each stimulus vector is typically a collection of binary bits, each of which is applied to a corresponding input of the design under test (DUT). The response of the DUT to the test stimulus is collected and analyzed. If the collected response agrees with the expected response then, to some degree of certainty, the DUT is believed by the circuit designer to be expressing the desired functionality. This type of conventional testing shall be referred to as "validation."

However, even if a DUT produces entirely expected results, from validation, the circuit designer still does not know the extent to which the test stimulus has exercised the DUT. Developing a measure of the extent to which validation has "exercised" a design is referred to as "coverage analysis."

In general coverage analysis consists of two steps: i) monitoring code execution during simulation, and ii) post simulation analysis to determine relevant items as "covered" or "not covered." The monitoring step stores what actually took place during simulation. The post simulation analysis step examines the data stored by the monitoring step. Specifically, post simulation analysis compares what is required for complete coverage with what actually took place to determine coverage or non-coverage of the relevant items. Examples of what may be chosen as "relevant items" are: whether a statement has executed or not, whether a register has changed in value, whether a finite state machine has transitioned from one state to another and whether a sub-expression has executed.

The more basic form of coverage analysis is controllability-based. Controllability-based coverage analysis provides a measure of the extent to which the DUT has been executed as a result of the validation.

There are several conventional types of controllability-based coverage known as line coverage, conditional coverage (also known as subexpression coverage) and state coverage. Line coverage indicates the lines of code, of the HLHDL specification, which have been executed as a result of the validation. Note that for purposes of line coverage, a "line" means a particular statement of the specification language. Conditional coverage looks at each expression which determines the branching of a conditional statement and determines the number of combinations of inputs, out of the total number of combinations possible, that have been executed by each conditional statement. State coverage determines the number of states of a finite state machine, or FSM, that have been executed in comparison to the FSM's total number of possible states.

While controllability-based coverage is a very basic and important measure, there is still additional and important information that it does not provide to the circuit designer. If controllability-based coverage determines that execution of a line of the DUT has not occurred, then an important piece of information has been provided to the circuit designer: the designer knows that the test stimulus utilized in validation should be enhanced until that execution of the DUT has happened. If, however, controllability-based coverage determines that a particular execution of the DUT has occurred, it still provides no indication as to whether the result of that execution has propagated to an observable output. An observable output is just any point in the DUT where the circuit designer is collecting validation results that will be analyzed for correctness. If the results of the execution do not produce an observable output then, even if it were producing erroneous output, such errors would not be detected in the validation. Therefore, the ability to augment controllability-based coverage techniques with observability-based coverage analysis is highly desirable.

SUMMARY OF THE INVENTION

The present invention relates to a technique for performing observability-based coverage, and in particular to observability-based line coverage.

The present invention augments the value of a conventional simulation signal to include not only a logical value, but also what we shall refer to as a "tag value."

Logical values are propagated during the course of simulation, in the preferred embodiment, by a conventional HDL Simulation Process while tag values are propagated by a Monitoring Process.

In the course of a simulation, the execution of every assignment statement (for which observability-based coverage is desired) "injects" (or produces) a tag value on its output signal. This injected tag contains an identifier which uniquely identifies the assignment statement that produced it (this is referred to as the "tag ID"). If this tag is propagated through the DUT such that it appears at an observable output, then the circuit designer knows (from the tag ID) that the assignment statement it identifies has satisfied observability-based line coverage.

A tag value also contains a "tag history." The tag history of a tag value X being injected by an assignment statement Y, contains copies of the tag values for assignment statements, earlier in the flow of control or in the flow of data, which are effecting the logical value of the signal being produced by assignment statement Y. The tag history of a tag value X is structured to reflect the sequence in which these earlier assignment statements have effected the logical value of assignment statement Y. The tag history of a tag value X may be empty (or null). Note that the tag ID for tag value X would typically be equal to Y (Y being a unique identifier of the assignment statement Y).

Typically, a tag value X also has a "tag last used" field which is set with the unique identifier "Z" of the last assignment statement to utilize tag value X since the tag value X has been assigned to the signal set by assignment Y. The amount of "utilization" of X by Z, required for X to have its tag last used updated with Z, is minimal. The tag last used field of X will be set to Z even if Z simply read the logical value of the signal to which X is assigned—it is not necessary that Z actually utilize X to form its tag value. If tag value X has just been created, then tag last used is initially set to zero.

An assignment statement, according to the preferred embodiment, is structured as follows. It comprises a left-hand-side (lhs) denoting a "target" signal (to which is assigned the result value) and a right-hand-side (rhs) "source" expression (which is evaluated to produce the value assigned to the lhs target signal). Each time an assignment statement is executed, its lhs target signal (or just "lhs signal") is assigned both a logical value and a tag value. The tag value is a data object, as described above, that comprises a tag ID, tag last used and a tag history. The tag ID portion of the resulting tag value can be determined, in one embodiment, by simply using the unique line number for the assignment statement. Determining the tag last used and the tag history portions of the tag value are more complex.

In general, we can say that the rhs of the assignment statement takes a number of signals (or values) as inputs and as a result of both the particular logical values assigned to its inputs, as well as the particular operators by which those logical values are processed, certain of those input signals will effect (or control) the logical value assigned to the lhs. In an abstracted version of an assignment statement, the lhs of assignment is some target signal represented as "out," and the rhs of the assignment may be considered to simply be a function "f" of its input variables which can been labeled $X_1$, $X_2$, ... $X_n$. At a particular point in the simulation when the assignment is to be executed, each of variables $X_1$, $X_2$, ... $X_n$ will have a logical value typically taken from the set {1, 0, x, z}. Each variable of $X_1$, $X_2$, ... $X_n$ will be considered as having an "effect" on the lhs if changing that variable, by itself, from its current logical value to another logical value will change the logical value assigned to the lhs.

For example, consider each of variables $X_1$, $X_2$, ... $X_n$ having the value 1 or 0 and the function f producing the value 0. If "flipping" the value of any one of the variables $X_1$, $X_2$, ... $X_n$, by itself, would cause the function f to "flip" its output from 0 to 1, then that variable's value is considered as producing an observable effect on the lhs.

Each signal of the rhs whose logical value is determined to have an observable effect on the logical value of the lhs signal has a copy of its tag value propagated to become part of the tag history of the new tag value injected onto the output signal of the assignment statement's lhs.

The above discussion, regarding propagation between assignment statements, is data-flow tag value propagation. Control-flow tag propagation relates, essentially, to those signals whose logical values determine whether or not the assignment statements are executed. For example, an "if" statement, if satisfied, may enable an assignment to be executed. The signals of that if's conditional expression, that observably controlled whether or not the conditional expression is satisfied, should also have their tag values propagate to the tag value produced by the enabled assignment statement.

In general, an assignment Y may be multiply nested within any number of flow of control (i.e., conditional) statements (this arbitrary number of flow of control statements being represented by the number "q"), each having a conditional expression which needs to be satisfied. These conditional expressions shall be referred to as $f_1, f_2, \ldots f_q$. Note that the conditional statements can be of any form. Each conditional expression, of each conditional statement, needs to be evaluated for its subset of observably-controlling signals. All the observably-controlling signals of all the conditional expressions are unioned with the observably-effecting (from a data-flow sense) signals of the rhs of the assignment to form a total subset of observable signals. For each member of the total subset, a copy of its tag value is created and made a child of the root tag value node for the tag injected by assignment Y.

An Instrumentation Process accepts HDL Source Code, as written by a circuit designer, and performs pre-processing to produce Instrumented HDL Source Code and Instrumentation Mapping Files. The pre-processing is intended to address issues of synchronization and efficiency in the preferred embodiment, but alternative embodiments, in which preprocessing is not utilized, not utilized to the same extent, or is utilized differently, could be used in accordance with the principles of the present invention.

In general, the pre-processing performs the following four main operations: i) it identifies assignment statements that, if executed, will be executed asynchronously during the course of the simulation (this type of assignment is referred to in the IEEE standard as a "continuous" assignment), ii) it identifies assignment statements that, if executed, will be executed synchronously (i.e., as part of the normal flow of control) during the course of the simulation (this type of assignment is referred to in the IEEE standard as a "procedural" assignment), iii) it identifies the conditional statement nesting that may be surrounding any of the synchronous assignment statements and iv) it identifies those constructs which are used to modularize an HLHDL program and provides for the correct propagation of tag values among these program components.

To deal with asynchronous assignment statements, the Instrumentation Process produces entries for an Expressions sub-file of the Instrumentation Mapping Files. These entries guide the construction of functions (referred to as PLI callback functions in the Verilog HDL embodiment) which are triggered by value changes of signals on the rhs of the asynchronous assignment statements and which call the Monitoring Process.

To handle synchronous assignment statements, the Instrumentation Process produces both entries for the Expressions sub-file and also inserts textual functions calls (referred to as PLI calls in the Verilog HDL embodiment) in the Instrumented HDL Source Code which call the Monitoring Process.

Conditional statement nesting of assignment statements is handled by adding each conditional statement's expressions to the Expressions sub-file entries of the synchronous assignment statements nested by that conditional.

Modularization constructs are typically handled in two ways depending upon the complexity of the module parameter. For either type of parameter, the end result is the production of callback functions triggered upon value changes of module parameters (thus being triggered when values are to be moved into, or out of, modules). Parameters that are an expression are typically handled in a manner very similar to asynchronous assignment statements with the Instrumentation Process producing entries for the Expressions sub-file that guide the construction of callback functions. Parameters that are a single signal are typically handled at the beginning of simulation by having the Monitoring Process search the design hierarchy and generate the callback functions.

While the HDL Simulation Process is simulating the Instrumented HDL Source code, the Monitoring Process produces an Observability History comprised of an Observability Coverage data structure and a Blocked Tags File. The Observability Coverage data structure typically contains an entry for each assignment statement of the HDL Source Code (i.e., the HLHDL program representing the DUT) that is not directly observable (and therefore needs use of the present invention to determine whether it has produced an observable output). Each time a tag value is assigned to a directly observable signal of the DUT, each assignment statement of the tag value's tag history is "checked off" in the Observability Coverage data structure as having been observed. This checking off is performed in terms of the line numbers of the non-instrumented HDL Source Code by use of the Instrumented to Non-instrumented sub-file of the Instrumentation Mapping Files. Each time a tag value is assigned to a signal of the DUT that is not directly observable, that tag value is written out to the Blocked Tags File. The tag values written to the Blocked Tags File are expressed in terms of the non-instrumented HDL Source Code line numbers by use of the Instrumented to Non-instrumented sub-file.

Note that when a tag value X is initially injected at a signal "S" due to an assignment statement Y, the tag value X has its "tag last used" field set to zero to indicate that no subsequently executed assignment statement has yet utilized the tag value.

Also note that when a tag value is initially injected at a signal "S," for every signal of the rhs of assignment statement Y, any tag value such signal has must have its "tag last used" field updated to Y. In addition, any conditional expressions in which Y is nested typically have their "tag last used" field updated to Y. Also, for hierarchically specified designs, there may be propagation of updates to tag last used values upwards or downwards in the module hierarchy.

Once the HDL Simulation Process has completed processing the Stimulus Vectors being applied to the DUT, the last tag values, associated with each signal set by an assignment statement, are all written to the Blocked Tags File by the Monitoring Process.

Next, the Observability Coverage data structure and the Blocked Tags File are processed by a Reporting Process to produce an Observability Report. A variey of Observability Reports can be produced depending upon the particular needs of the circuit designer and of the circuit design project.

A Reporting Process typically scans the Observability Coverage data structure to determine which assignment statements have not been "checked off" and have therefore not produced at least one observable output. For each of those unobserved assignment statements, its unique line number (which shall be referred to as "L") is typically used to search the Blocked Tags File. Specifically, tag values whose tag ID, or whose tag history, contain the value L are located. For tag values so located, the assignment statement responsible for blocking L's further traversal can be identified from the tag's "tag last used" value.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 2 depicts the structure of a tag value in accordance with the present invention;

FIGS. 3A through 3F illustrate assignment statements and their resulting tag value structure;

FIG. 4 shows an assignment statement inside a nested conditional expression control structure;

FIGS. 5A through 5H show exemplary Verilog HDL program fragments and several of the files produced when processed in accordance with FIG. 1.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

The present invention relates to a technique for performing observability-based coverage. As with controllability-based coverage, there are three main types of observability-based coverage referred to as line coverage, conditional coverage and state coverage. As for controllability-based coverage, for purposes of observability-based line coverage, a "line" means a particular statement of the specification language. While the preferred embodiment of the present invention is presented in terms of observability-based line coverage, the principles of the present invention can also be applied to conditional and/or state coverage.

Observability-based conditional coverage seeks to determine whether each sub-expression of a conditional statement has been covered. If a sub-expression of a conditional statement has produced an observable output, when executed, then the sub-expression has been covered.

Observability-based state coverage seeks to determine whether the entry of each new state by a finite state machine has resulted in an observable output.

1. System Overview

Figure 1:
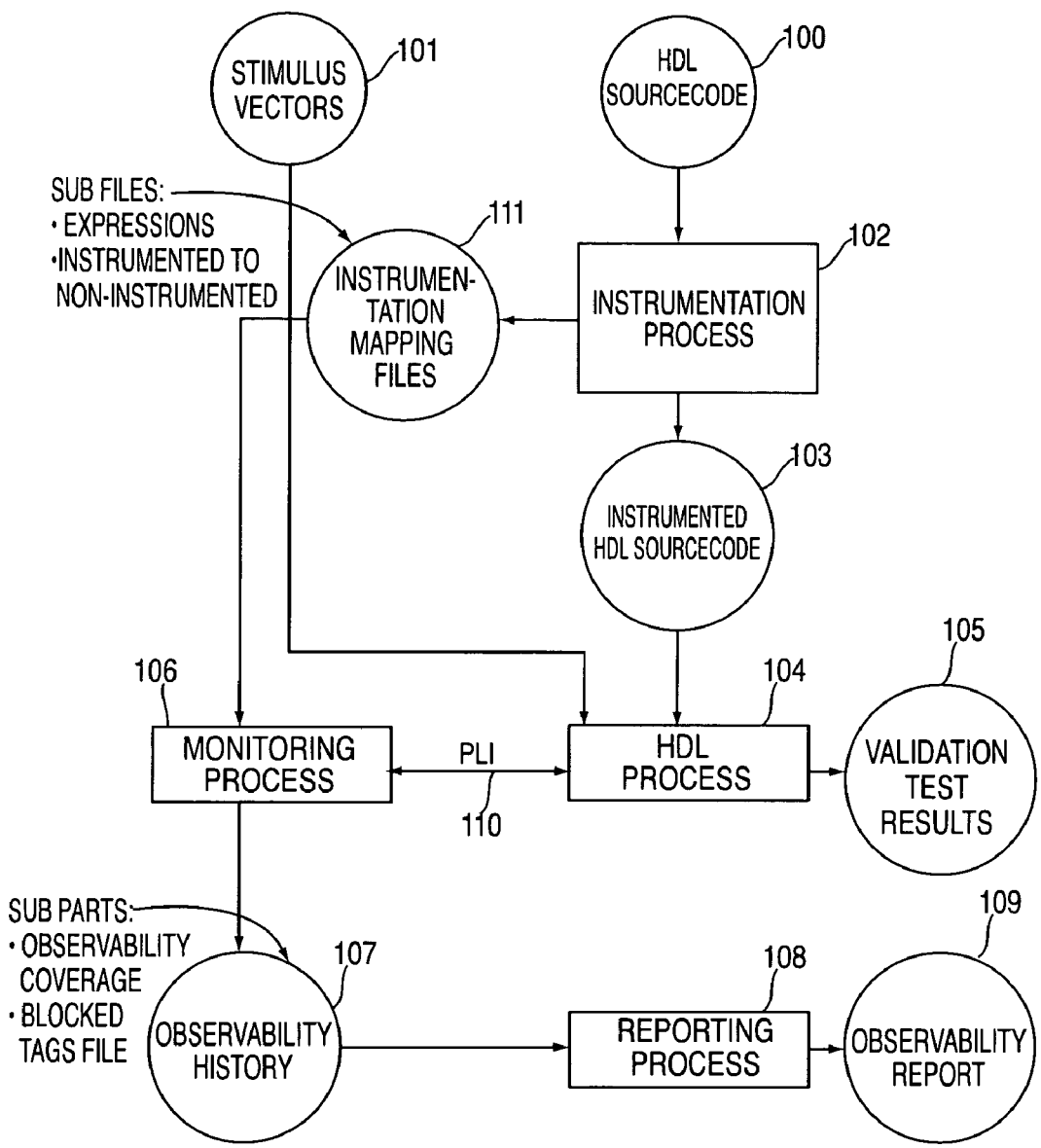
FIG. 1 shows an overview of the system within which the present invention is utilized.

FIG. 1 depicts an overview of a system within which the present invention can be utilized.

Conventional validation is accomplished with the following parts of FIG. 1. The DUT is input as HDL Source Code 100 and a test stimulus for exercising the DUT is provided as Stimulus Vectors 101. HDL Source Code 100 is input directly to HDL Simulation Process 104 (bypassing steps 102 and 103) and the responses of the DUT, to Stimulus Vectors 101, are recorded in Validation Test Results 105. The Validation Test Results 105 would be evaluated, for example by comparing the test results to some standard test result file, and the DUT is determined to have "passed" validation favorably if the results of such comparison indicate no differences.

The HDL Source Code 100 can be written in any programming language at any level of abstraction. Typically, the HDL Source Code 100 describes a circuit design to be tested and therefore the "HDL" stands for Hardware Description Language. Typically, the HDL Source Code 100 is written in an HLHDL, such as Verilog HDL. In this case, HDL Simulation Process 104 can be provided by any one of a variety of standard commercially available Verilog HDL simulators, such as "VCS" which is available from Synopsys, Inc., of Mountain View, Calif. It should be understood, however, that languages other than recognized "hardware description languages" can be utilized to specify a circuit design and are therefore suitable inputs as HDL Source Code 100. For example, the C programming language, while mainly utilized for software programming purposes, could be adapted to the specification of a circuit design.

The present invention adds the following processes and/or steps to this validation process.

Before being input to the HDL Simulation Process 104, the HDL Source Code 100 is pre-processed by Instrumentation Process 102. Instrumentation Process 102 translates the HDL Source Code 100 into Instrumented HDL Source Code 103 and Instrumentation Mapping Files 111. Instrumented HDL Source Code 103 operates, under validation, in the same manner as HDL Source Code 100 and therefore produces the same Validation Test Results 105. Instrumented HDL Source Code 103 has had added to it, however, function calls to a Monitoring Process 106 which permit observability-based coverage, of the execution of HDL Source Code 100, to be performed. Instrumentation Mapping Files 111 also specify the calling of functions, by the Instrumented HDL Source Code 103, such that observability-based coverage can be performed.

Specifically, if HDL Simulation Process 104 is a Verilog HDL simulator, then Instrumented HDL Source Code 103 contains calls through the Verilog HDL Programming Language Interface (or PLI) to the Monitoring Process 106, wherein the Monitoring Process 106 is typically a program written in the C programming language. The Instrumented HDL Source Code 103 is provided with both specific textual function calls to Monitoring Process 106 (as permitted by the PLI), while Instrumentation Mapping Files 111 specify certain signals being indicated as callback nodes to Monitoring Process 106 (as also permitted by the PLI). Once the HDL Simulation Process 104 has invoked the Monitoring Process 106, Monitoring Process 106 is able to examine the value of nodes of the HDL Simulation Process 104 (also in the manner permitted by the PLI) in order to determine how observability-based code coverage is to proceed. This bidirectional communication between HDL Simulation Process 104 and Monitoring Process 106 is indicated by bidirectional PLI edge 110.

More specifically, Instrumentation Mapping Files 111 is comprised of the Expressions sub-file and the Instrumented to Non-instrumented sub-file. The Instrumented to Non-instrumented sub-file is utilized by Monitoring Process 106 in reporting the observability-based results to the circuit designer. The Expressions sub-file is utilized by Monitoring Process 106 in its performance of the PLI calls (both the textual calls of the Instrumented HDL Source Code 103 and the callbacks) made by HDL Simulation Process 104.

As Monitoring Process 106 operates, it produces an Observability History 107. Once the Validation Test Results file 105 is complete, as part of the post-processing, the Observability History 107 is processed by a Reporting Process 108 to produce an Observability Report 109 which the circuit designer can use to determine the extent to which the Stimulus Vectors 101 have covered the DUT specified by HDL Source Code 100.

2. Observability-Based Assignment Statement Coverage

As discussed above, a preferred embodiment of the present invention determines observability-based line coverage and in particular it determines observability-based assignment statement coverage. Observability-based assignment statement coverage determines whether an assignment statement has, in response to a set of stimulus vectors, produced at least one result which has effected at least one value at an observable output of the DUT. The basic mechanism by which the preferred embodiment accomplishes this is as follows.

A conventional Verilog HDL simulation consists of signals (or nodes) between which are propagated the values of either "1" (meaning a logical state of one), "0" (meaning a logical state of zero), "x" (meaning an unknown logical state) or "z" (meaning a high-impedance state). These conventional values of signals shall be referred to collectively as a "logical value."

The present invention augments the value of a conventional simulation signal to include not only a logical value, but also what we shall refer to as a "tag value."

In relating the logical value and tag value of a signal to the system of FIG. 1, logical values are propagated during the course of simulation by the conventional HDL Simulation Process 104 while tag values are propagated by the Monitoring Process 106.

In the course of a simulation, the execution of every assignment statement "injects" (or produces) a tag value on its output signal. This injected tag will always contain an identifier which uniquely identifies the assignment statement that produced it (this is referred to as the "tag ID"). If this tag is propagated through the DUT such that it appears at an observable output, then the circuit designer knows (from the tag ID) that the assignment statement it identifies has satisfied observability-based line coverage.

A tag value also contains a "tag history." The tag history of a tag value X being injected by an assignment statement Y, contains copies of the tag values for assignment statements, earlier in the flow of control or in the flow of data, which are effecting the logical value of the signal being produced by assignment statement Y. The tag history of a tag value X is structured to reflect the sequence in which these earlier assignment statements have effected the logical value of assignment statement Y. The tag history of a tag value X may be empty (or null).

An example tag value X is shown in FIG. 2 and is indicated by arrow 200. Tag value X has three main parts. First, a tag ID 201 which indicates that it is produced by assignment Y. "Y" is intended to be any unique identifier of the assignment statement producing tag X. Second, a tag last used 203 is set with the unique identifier "Z" of the last assignment statement to utilize tag value X since the tag 200 has been assigned to the signal set by assignment Y. If tag value X has just been created, then tag last used 203 is initially set to zero. Third, tag value X has a tag history 202. As can be seen, the tag history is organized as a tree. Each level of the tree represents an earlier placement in the sequence of assignment statements which have effected the value produced by Y. The amount of branching of a node of the tree represents the assignment statements which, in parallel, effected the assignment statement of which they are a child. For example, assignment statement Y is shown to be dependent, in parallel, upon the results of assignment statements Y.1 and Y.2. Likewise, assignment statement Y.1 is shown to be dependent, in parallel, upon assignment statements Y.1.1 and Y.1.2. Y.2 is shown to be dependent, in parallel, upon Y.2.1 and Y.2.2. In sequence, it is known, for example, that assignments Y.1.1 and Y.1.2 effected Y.1 and then Y.1 effected Y. Likewise, Y.2.1 and Y.2.2 effected Y.2 and then Y.2 effected Y.

More specifically, an assignment statement, according to the preferred embodiment, is structured as follows. It comprises a left-hand-side (lhs) denoting a "target" signal (to which is assigned the result value) and a right-hand-side (rhs) "source" expression (which is evaluated to produce the value assigned to the lhs target signal). Each time an assignment statement is executed, its lhs target signal (or just "lhs signal") is assigned both a logical value and a tag value. The tag value is a data object, as described above, that comprises a tag ID, tag last used and a tag history. The tag ID portion of the resulting tag value can be determined, in one embodiment, by simply using the unique line number for the assignment statement. Determining the tag last used and the tag history portions of the tag value are more complex.

In general, we can say that the rhs of the assignment statement takes a number of signals (or values) as inputs and as a result of both the particular values assigned to its inputs, as well as the particular operators by which those values are processed, certain of those input signals will effect (or control) the value assigned to the lhs. An abstracted version of an assignment statement 302 is shown in FIG. 3A. The lhs of assignment 302 is some target signal 300 represented as "out." The rhs 301 of the assignment 302 may be considered, in an abstract way, to simply be a function of its input variables which have been labeled $X_1, X_2, \ldots X_n$. At a particular point in the simulation when the assignment represented by FIG. 3A is to be executed, each of variables $X_1, X_2, \ldots X_n$ will have a value taken from the set $\{1, 0, x, z\}$. Each variable of $X_1, X_2, \ldots X_n$ will be considered as having an "effect" on lhs 300 if that variable, by itself, from its current logical value to another logical value will change the logical value assigned to the lhs 300.

For example, consider each of variables $X_1, X_2, \ldots X_n$ having the value 1 or 0 and the function f producing the value 0. If "flipping" the value of any one of the variables $X_1, X_2, \ldots X_n$, by itself, would cause the function f to "flip" its output from 0 to 1, then that variable's value is considered as producing an observable effect on lhs 300.

Let us assume that a certain subset of the variables $X_1, X_2, \ldots X_n$ is determined to have an observable effect on "out" (i.e., lhs 300). Let us refer to the variables of this subset as $T_1, T_2, \ldots T_m$, where m is less than or equal to n. The tag history for assignment 302 is created as follows. Please also see FIG. 3B.

For each signal $T_1, T_2, \ldots T_m$, it is assumed to have a current tag value which shall be referred to, respectively, as tag_value ($T_1$), tag_value ($T_2$), ... tag_value ($T_m$). A "tag value node" 303 is created, which consists of a tag ID portion 304 (set to the unique identifier for assignment statement 302), tag last used 314 (initialized to zero) and an array of m pointers indicated as pointer 305, pointer 306 ... pointer 307. A copy of the current tag value for each of signals $T_1, T_2, \ldots T_m$ is created, and these are indicated by, respectively, "root" tag value nodes 308, 309 ... 310. Note that these are copies of the current tag values, except that the tag last used field is omitted. Therefore, a tag value is generally constructed to only have the tag last used field in its root tag value node and not in any of the tag value copies of its tag history. It is understood that under each of the copy root-nodes 308, 309 ... 310 may be a tag history tree structured in accordance with FIG. 2. Note that each of tag value nodes 308, 309 ... 310 has, respectively, a tag ID 311, 312, ... 313. Tag ID 311 uniquely indicates, for example, the assignment statement to last assign a value to signal $T_1$, prior to the execution of assignment 302. Likewise, Tag ID 312 uniquely indicates the assignment statement to last assign a value to signal $T_2$, prior to the execution of assignment 302 and Tag ID 313 uniquely indicates the assignment statement to last assign a value to signal $T_m$, prior to the execution of assignment 302. Pointer 305 is set to point to tag value node 308, pointer 306 is set to point to tag value node 309, ... and pointer 307 is set to point to tag value node 310. Once tag value 303 has been created, it replaces the tag value, if any, that had been assigned to the signal "out" of assignment 302.

Also, the tag last used value for any current tag value of any of the signals $X_1, X_2, \ldots X_n$ is set to the value of tag ID 304 since that it is now the most recent assignment statement to have utilized those signals. Note that for purposes of the tag last used value, an assignment statement has "utilized" a signal simply by reading it for purposes of determining whether it was observably controlling, this broad meaning of "utilized" is necessary such that the tag last used value will reflect the assignment statement wherein its tag value was blocked from further progress towards an observable output.

It is important to note that in the above discussions, and in the discussion that follows, that the term "signal" refers to a unique "node" of the specified circuit. Therefore, a signal is different from the various variable names which may be specified in an HLHDL program. The same variable name may refer to a different signal depending upon the context in which it occurs and the scoping rules of the HLHDL.

Let us consider the above discussion in the context of a specific and simple example Verilog HDL assignment statement 330 as depicted in FIG. 3C. As can be seen, the lhs of assignment 330 has a target signal denoted by the variable "out," while the rhs is the logical AND of signals denoted by "a" and "b."

Let us assume that when 330 is about to be executed, signal "a" has the logical value 0 while signal "b" has the logical value 1. The logical AND of these two logical values is a 0, and this would be the logical value assigned to signal "out" as part of a conventional Verilog HDL simulation. Applying the "flipping rule" presented above, it can be seen that signal "a" is considered to have an observably controlling effect on the logical value assigned to "out," while flipping the value of "b," by itself, would not change the logic value assigned to "out." Therefore, in constructing the tag value for assignment 330, only a copy (the "copy" excluding the tag last used value) of the pre-existing tag value for the signal "a" will be incorporated into the tag history.

Let us now assume, however, that when 330 is about to be executed both signal "a" and signal "b" have the value of 1 and therefore the logical value to be assigned to signal "out" is 1. Applying the flipping rule in this case indicates that both signals "a" and "b" are observably controlling the value assigned to "out." Therefore, in constructing the tag value for assignment 330, a copy of the pre-existing tag value for signal "a" and a copy of the pre-existing tag value for signal "b" will both be made children of the root tag value node.

In summary, the rule for which signals of a logical AND have their tag values propagate is specified in Appendix A. Appendix A specifies similar tag value propagation rules for all the other operators which may appear on the rhs of an assignment statement. These rules of Appendix A were derived by applying the basic flipping rule.

In order to determine tag value propagation for an assignment statement whose rhs is of arbitrary complexity, the rules of Appendix A are applied as follows. A parse tree of the rhs is derived. Starting from the leaf nodes of the parse tree (each leaf node having the logical value assigned to its signal and a copy, minus the tag last used value, of its signal's current tag value), the controlling signals of each of the lowest level operators are determined and used to form an intermediate subset of controlling tag values, associated with that intermediate node. The appropriate logical value is also associated with the intermediate node. Each successively higher-level operator of the parse tree has its intermediate subset of controlling tag values determined by unioning together the subset associated with each of its child nodes that is controlling. Also, each successively higher-level operator has its logical value determined from the logical value of each of its child nodes. From the tag values propagated to the root-level node, a tag value is constructed whose tag value node: has a tag ID that is the unique identifier of the assignment statement which was parsed (typically a line number), has a tag last used value of zero and whose tag history points to the copies of the tag values inherited by the root of the parse tree. The logical value output by the root operator is also the logical value assigned to the signal represented by the lhs identifier.

Figures 3F, 4:
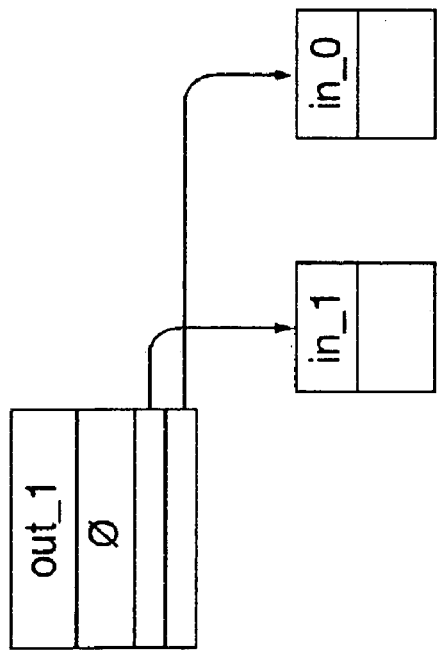

This rule-based approach to determining which tag values on the rhs of an assignment are propagated to the lhs is illustrated by the example of FIGS. 3D–3F. FIG. 3D depicts an example assignment statement which has two levels of Boolean operators. FIG. 3E shows a parse tree of the rhs of the assignment of FIG. 3D. As can be seen, each leaf node of the parse tree has a logical value and a tag value. For example, leaf node 340 has a logical value of 0 and a tag value whose tag ID portion 347 indicates it was injected by a particular assignment statement that set the value of the unique signal represented by "in_3." Leaf node 341 has a logical value of 1. The result of logical AND 342, as indicated by FIG. 3E, is 0. Since only input "in_3" of leaf node 340 controlled the logical value for 342, only a copy of the tag value for node 340 is propagated to be the tag value for node intermediate node 342. With regard to the tag values for node 345, the tag values for both of its leaf nodes are included in its tag subset since both are controlling. With regard to root node 346, only copies of the tags of node 345 propagate to become part of its tag subset since only the logical value of node 345 controls the logical value of node 346. FIG. 3F depicts the tag value constructed for the lhs signal "out_1" of the assignment of FIG. 3D.

3. Control-Flow Tag Propagation

The above discussion, regarding propagation between assignment statements, is data-flow tag value propagation. Control-flow tag propagation relates, essentially, to those signals whose values determine whether or not the assignment statements are executed. For example, an "if" statement, if satisfied, may enable an assignment to be executed. The signals of that if's conditional expression, that observably controlled whether or not the conditional expression is satisfied, should also have their tag values propagate to the tag value produced by the enabled assignment statement.

FIG. 4. Here, assignment statement 302 has been placed in a control-flow context of two nested "if" statements, both of which must be satisfied in order for assignment 302 to be executed. Just as with function f of assignment statement 302, function $f_1$ of outer "if" 440 and function $f_2$ of inner "if" 441 must each be evaluated for their subset of signals which have an observable effect on whether the function is satisfied.

The signals in the subset which have an observable effect on whether $f_1$ is satisfied shall be referred to as $U_1, U_2, \ldots U_e$, where "e" is less than or equal to t. In general, whether a signal W of $f_1$ is a member of the subset can be determined by the flipping rule: if flipping the logical value of signal W would change $f_1$ from being satisfied to not satisfied, then, under the current assignment of logical values to the signals of $f_1$, W has an observable effect. Typically, however, $f_1$ would be expressed as an expression of operators, in a similar fashion to the manner in which the rhs 301 of assignment 302 would typically be expressed. In such a case, the expression of $f_1$ would be parsed, and the parse tree processed according to the rules of Appendix A.

The signals in the subset which have an observable effect on whether $f_2$ is satisfied shall be referred to as $V_1, V_2, \ldots V_f$, where "f" is less than or equal to "p."

In determining the tag value for the signal represented by the lhs 300 of assignment 302, the tag history is created in the same manner as the tag history shown in FIG. 3B for the assignment 302 by itself, except that the subset $T_1, T_2, \ldots T_m$ is augmented by unioning it with the subsets $U_1, U_2, \ldots U_e$ and $V_1, V_2, V_f$.

In general, an assignment 302 may be multiply nested within any number of flow of control (i.e., conditional) statements (this arbitrary number of flow of control statements being represented by the number "q"), each having a conditional expression which needs to be satisfied. These conditional expressions shall be referred to as $f_1, f_2, \ldots f_q$. Note that the conditional statements can be of any form, including, but not limited to: "if," the "else" branch of an "if," or a "case" statement. Each conditional expression, of each conditional statement, needs to be evaluated for its subset of observably-controlling signals. This may be done by application of the flipping rule, or by constructing a parse tree and applying the appropriate rules of Appendix A. All the observably-controlling signals of all the conditional expressions are unioned with the observably-effecting (from a data-flow sense) signals of the rhs of the assignment to form a total subset of observable signals. For each member of the total subset, a copy of its tag value is created and made a child of the root tag value node for the tag injected by assignment 302. The tag ID field of the root tag value node is set to contain the unique identifier for assignment 302. Notice that the various conditional statements that control whether or not assignment 302 are executed are all treated, for tag value injection purposes, as being executed simultaneous with the execution of the assignment statement 302 itself.

Tag last used values are updated as follows. For every signal of the conditional expressions $f_1, f_2, \ldots f_q$, having a tag value, its tag last used value is updated to reflect that assignment 302 was the last assignment statement for which it was considered as at least potentially observably controlling. Note that all of the signals of all of the conditional expressions have their tag last used value updated regardless of whether or not the signal was, in fact, observably controlling upon whether assignment 302 executed. As discussed above, this broad definition of "utilized," for purposes of the tag last used value, is intended to permit the tag last used value to indicate where a tag value is blocked from further progress towards an observable output.

4. Tag Propagation Implementation Issues

The specifics of how the above-described tag value propagation is accomplished, within the architecture of FIG. 1, will is described below.

The architecture of FIG. 1 addresses two main issues: i) the synchronization of Monitoring Process 106 with HDL Simulation Process 104, and ii) the efficient propagation of tag values by Monitoring Process 106.

As discussed above, Instrumentation Process 102 accepts HDL Source Code 100, as written by a circuit designer, and performs pre-processing to produce Instrumented HDL Source Code 103. The pre-processing is intended to address both main issues of synchronization and efficiency.

In general, the pre-processing performs the following four main operations: i) it identifies assignment statements that, if executed, will be executed asynchronously during the course of the simulation (this type of assignment is referred to in the IEEE standard as a "continuous" assignment), ii) it identifies assignment statements that, if executed, will be executed synchronously (i.e., as part of the normal flow of control) during the course of the simulation (this type of assignment is referred to in the IEEE standard as a "procedural" assignment), iii) it identifies the conditional statement nesting that may be surrounding any of the synchronous assignment statements and iv) it identifies those constructs which are used to modularize a Verilog HDL program and provides for the correct propagation of tag values among these program components. The response of Instrumentation Process 102, to the identification of each of these coding constructs, is discussed below.

4.1 Assignment Statements

In Verilog HDL, asynchronous assignment statements are specified by prefixing an ordinary assignment statement with the "assign" operator. During the course of the simulation, should any signal specified on the rhs of the asynchronous assignment change in value, the assignment statement is executed. The PLI of Verilog HDL is utilized as follows to achieve tag propagation when an asynchronous assignment statement is executed. Whenever the value of a callback signal changes (this being any signal on the rhs of the asynchronous assignment), during simulation, the specified callback function is called, along with a specified parameter. The callback function, which is part of Monitoring Process 106, performs the tag value propagation. How such callback functions are set up, and the form of the parameter passed to it, will be discussed below.

For efficiency purposes (in order to minimize the number of PLI calls to Monitoring Process 106), when dealing with synchronous assignment statements, Instrumentation Process 102 identifies "atomic" blocks of synchronous assignment statements. Atomic blocks are collections of assignment statements where, if any one of the assignment statements is executed during the course of the simulation, then all of the assignment statements of the atomic block must be executed. Prior to each such atomic block of synchronous assignment statements, Instrumentation Process 102 inserts a procedural PLI call, along with a specified parameter, to a function of Monitoring Process 106. This function called shall be referred to as an "atomic function." The operation of the atomic function and its parameter, is discussed below.

Instrumentation Process 102 inserts an atomic function call which contains, as its parameter, an identifier which uniquely identifies the atomic block of synchronous assignment statements to which it applies. Each statement of the Verilog HDL program is given a unique "line number" and so the parameter passed to the atomic function can simply be the line number, in the Instrumented HDL Source Code 103, of the inserted atomic function call itself.

For each atomic block, identified by Instrumentation Process 102 in HDL Source Code 100, Instrumentation Process 102 generates one or more "entries" in the Expressions sub-file of Instrumentation Mapping Files 111. In general, if an atomic block consists of "g" assignment statements, then "g" entries are added by Instrumentation Process 102 to the Expressions sub-file. Each of these entries is pre-determined by Instrumentation Process 102 to contain all the information needed, by the atomic function, to propagate the tag values of an assignment statement of an atomic block. In particular, each entry contains the following fields:

PLI_call_instrumented_line_num,
assign_stmt_instrumented_line_num,
lhs_signal,
rhs_expression.

The "PLI_call_instrumented_line_num" field is set to contain the unique line number of the inserted call to the atomic function for an atomic block of assignment statements. The "assign_stmt_instrumented_line_num" field is set to contain the unique line number of an assignment statement, in Instrumented HDL Source Code 103, in that atomic block identified by the entry's PLI_call_instrumented_line_num. "lhs_signal" is set to specify the target signal to which the tag value of executing the assignment statement is propagated, while "rhs_expression" is set to specify the rhs expression of the assignment statement and the signals it utilizes.

The operation of the inserted atomic function calls in Instrumented HDL Source Code 103, along with the entries of the Expressions sub-file, during simulation is as follows. The atomic function is called with a unique identifier of the atomic block to which it applies. This unique identifier being the unique line number, of the atomic function call itself, in the Instrumented HDL Source Code 103. The atomic function searches for all entries of the Expressions sub-file whose PLI_call_instrumented_line_num field matches the line number passed to it as a parameter. For each of these entries, the expression of the rhs_expression is processed to determine, under the currently prevailing simulation logical values, which of its signals has an observable effect on the result of the assignment. From that subset of observably effecting signals, and from the signal specified by the lhs_signal field, the tag value to be propagated to the signal specified by the lhs_signal field is determined.

If the lhs_signal specified by an entry is not an observable signal (for the purposes of validation), then the tag value determined for lhs_signal is written out, typically in a suitable textual form, to a "Blocked Tags File" of the Observability History 107, for post-simulation analysis of observability-based coverage by Reporting Process 108. If the lhs_signal is observable, then each signal specified in the tag history of the tag value computed is "checked" off as having been observed, and the tag value produced for lhs signal is discarded. Note that this "checking off" of signals as having been observed is recorded in an "Observability Coverage data structure," that is also part of Observability History 107. The Observability Coverage data structure has an entry for each assignment statement whose output is not observable.

It should be noted that the circuit designer is viewing line numbers in terms of his or her uninstrumented HDL Source Code 100. The Instrumented to Non-instrumented sub-file of Instrumentation Mapping Files 111 is utilized to convert the observability results to a form that can be understood by the circuit designer. The Instrumented to Non-instrumented sub-file contains a mapping between the unique line numbers of the input HDL Source Code 100 and the unique line numbers of the Instrumented HDL Source Code 103. Once an observable signal is reached, as determined by a tag value being generated for a signal indicated as observable within the Instrumented HDL Source Code 103, the line numbers the tag history specifies as being observed are converted (by the Instrumentation to Non-instrumentation sub-file) into the line numbers specified by HDL Source Code 100 when writing to the Observability Coverage data structure of Observability History 107. Similarly, if a tag value is being injected at an unobservable signal, then its tag history is written out to the Blocked Tags File of Observability History 107 in terms of HDL Source Code 100 line numbers by aid of the Instrumented to Non-instrumented sub-file.

Asynchronous assignments also have entries produced by Instrumentation Process 102 for the Expressions sub-file. The entries are the same as for synchronous assignment statements, except that the PLI_call_instrumented_line_num field is set to some special value, typically zero, to indicate that there is no PLI call actually inserted into the Instrumented HDL Source Code 103. When the HDL Simulation Process 104 is started, its first action is to perform a callback to a function within Monitoring Process 106 that shall be referred to as the asynchronous assignment setup process (AASP). The AASP locates those entries of the Expressions sub-file with the PLI_call_instrumented_line_num set to zero. For each such entry, it examines the value of rhs_expression to determine which signals should have callback functions and to assemble the necessary parameter for passing to the callback function.

Specifically, for each callback node "cbnode_x," let the number of assignment statements triggered by its changing its logical value be "cbnode_x_assign_stmts." Each of these cbnode_x_assign_stmts assignment statements has an entry in the Expressions sub-file and all of these entries need to be collected by AASP such that they are passed to the callback function of cbnode_x as a parameter whenever cbnode_x changes its logical value during simulation. The callback function then processes the entries of its parameter in the same manner as the atomic function described above, except that the PLI_call_instrumented_line_num field of the entries is not needed Other than ignoring PLI_call_instrumented_line_num, the callback function simply steps through the entries passed to it, generating tag values in the same way as for an atomic block of synchronous assignment statements.

4.2 Conditional Statements

Instrumentation Process 102 also identifies the conditional statements within which any atomic block of synchronous assignment statements may be nested. The functions (i.e., conditional expressions) for each of these conditional statements is identified. These functions shall be referred to, in general, as functions $f_1, f_2, \ldots f_q$, as discussed above. For each of the synchronous assignment statements in an atomic block, an entry of the Expressions sub-file (as discussed above in Section 4.1) is created. For each of these entries, the list of functions $f_1, f_2, \ldots f_q$ is simply appended to the rhs_expression list. When formulating the tag value for the signal specified by an entry's lhs_signal, each of the items of the rhs_expression list is evaluated individually (also as discussed above) for its subset of observably controlling signals. The results of all these subsets are simply unioned together for purposes of determining the tag value for the lhs_signal.

4.3 Modularization Statements Verilog HDL supports a hierarchical hardware description structure by allowing modules to be embedded within other modules. Higher-level modules create instances of lower-level modules and communicate with them through input, output and bidirectional ports.

As an example of a module hierarchy, consider a system consisting of printed circuit boards (PCBs). The system would be represented as the top-level module and would create instances of modules that represent the boards. The board modules would, in turn, create instances of modules that represent IC's, and the IC's could, in turn, create instances of modules such as flip-flops, mux's and alu's.

To describe a hierarchy of modules, the user provides textual definitions of the various modules. Each module definition stands alone; the definitions are not nested. Statements within the module definitions create instances of other modules, thus describing the hierarchy. The module instantiation statement creates the named instances.

A module definition in Verilog HDL is enclosed between the keywords "module" and "endmodule." The identifier following the keyword "module" is the name of the module being defined. The optional list of ports specifies an ordered list of ports of the module. The ports identified are declared as input, output and inout. In general, when a module definition "A" is instantiated as an instance "B" within a higher level module definition "C," the names assigned by module definition "C" to the ports by which it interfaces with instance "B" can be completely different from the names for those ports within the module definition "A."

The mechanism by which tag values are propagated, into and out of module instances, is accomplished by use of the same type of callback function utilized for asynchronous assignments. This is made possible by the fact that every signal in Verilog HDL has a unique hierarchical path name. Within the general situation of a module definition "A," an instantiation "B" of definition "A," and the instantiation being within a module definition "C," the propagation of tag values operates as follows. A callback function is associated with each signal of the module definition C that acts as an input to instance B. In addition, a callback function is associated with each signal within module instance B that acts as an output. Whenever an input signal "input_X" to instance B changes, a callback function is called with an appropriate parameter, of the same format as for asynchronous assignments, that causes the propagation of the tag value for input_X to the corresponding signal for input_X within the instance B. Whenever an output signal "output_X" internal to an instance B changes, a callback function is called with an appropriate parameter that causes the propagation of the tag value for output_X to the corresponding signal for output_X within the module definition C.

If an input_X is itself an expression, then a callback function is associated with each signal of input_X such that the callback function is called if any one of its signals changes. In the entry passed as a parameter to the callback function, the "rhs_expression" field is simply the entire expression represented by input_X which is evaluated, in the same manner discussed above, in order to determine which tag values of the expression are propagated to the tag value created for the corresponding signal to input_X within instance B.

It may be advantageous to generate these callback functions, for module parameter propagation, differently depending upon the form of the parameter. If input_X is an expression, then it may be desirable to have the Instrumentation Process 102 produce an entry for the Expressions sub-file, which entry is very similar to an entry produced for an asynchronous assignment statement with input_X serving as the rhs_expression and the corresponding signal for input_X, within instance B, serving as the lhs_signal. The assign_stmt_instrumented_line_num of the entry is typically set to zero since the line number (of the module instantiation) is typically inapplicable for non-assignment statements. Such entries are converted to callback function calls by the AASP process as described above.

For an input_X which is just a single signal, or for any output_X (which is typically a single signal), it may be advantageous to not generate an entry for the Expressions sub-file. Rather, a module asynchronous assignment setup process (MAASP) may also be executed as part of the first callback to Monitoring Process 106 (such first callback also initiating AASP as discussed above). MAASP searches through the hierarchy of the design (using standard PLI calls) and gets the port connectivity information necessary for construction of the appropriate parameters for the appropriate callback functions.

Note that the hierarchical description of a hardware structure has implications for propagating the updating of the tag last used value both upwards and downwards within the module hierarchy.

For example, suppose an assignment statement "upwards_prop" is executed within a lower-level module instance B, and the rhs of the assignment statement "upwards_prop" utilizes certain signals, which we shall refer to as higher_level_source$_1$, higher_level_source$_2$, . . . higher_level_source$_n$, whose values were input to instance B by a higher-level module definition C. Signals higher_level_source$_1$, higher_level_source$_2$, . . . higher_level_source$_n$, being local to instance B, have their tag last used value, of any tag value each may have, updated to indicate assignment statement "upwards_prop" as having last utilized them. In addition, however, there is a higher-level signal in module definition C corresponding to each of higher_level_source$_1$, higher_level_source$_2$, . . . higher_level_source$_n$, and we shall refer to each of these higher-level signals as higher_level_signal$_1$, higher_level_signal$_2$ . . . higher_level_signal$_n$. The tag last used value is typically also updated for each of higher_level signal$_1$, higher_level_signal$_2$, . . . higher_level_signal$_n$ in order to indicate their last having been utilized by assignment statement "upwards_prop."

Alternatively, suppose an assignment statement "downwards_prop" is executed within a higher-level module definition C, and the rhs of the assignment statement "downwards_prop" utilizes certain signals, which we shall refer to as lower_level_source$_1$, lower_level_source$_2$, . . . lower_level_source$_n$, whose values were output to module definition C from a lower-level module instance B. Signals lower_level_source$_1$, lower_level_source$_2$, . . . lower_level_source$_n$, being different from signals within instance B, have their tag last used value, of any tag value each may have, updated to indicate assignment statement "downwards_prop" as having last utilized them. In addition, however, there is a lower-level signal in module instance B corresponding to each of lower_level_source$_1$, lower_level_source$_2$, . . . lower_level_source$_n$, and we shall refer to each of these lower-level signals as lower_level_signal$_1$, lower_level_signal$_2$, . . . lower_level_signal$_n$. The tag last used value is typically also updated for each of lower_level_signal$_1$, lower_level_signal$_2$, . . . lower_level_signal$_n$ in order to indicate their last having been utilized by assignment statement "downwards_prop."

4.4 Examples of Tag Propagation Implementation

FIG. 5A depicts a Verilog HDL program fragment that illustrates the above discussion. The code of FIG. 5A depicts part of a program that would be input at HDL Source Code 100 Each assignment of FIG. 5A has been given a unique line number. The first two assignments, at line numbers 10 and 20, are asynchronous. The next two assignments, at line numbers 30 and 40, constitute an atomic block in that both of these assignments are always executed if either one of them is ever executed. These assignments are inside a "begin/end" block that is "always" executed whenever signal "clk" has a positive edge. Note that the last two assignments, at lines 50 and 60, are not part of the atomic block of the assignments at 30 and 40 since lines 50 and 60 are executed conditionally.

FIG. 5B depicts the Instrumented HDL Source Code 103 that results from applying Instrumentation Process 102 to the Verilog HDL code of FIG. 5A. As can be seen, the major difference is the insertion of textual PLI calls to the atomic function entitled "$pli." These PLI calls have been given line numbers 30, 60 and 80 and the line numbers for the assignment statements have been accordingly renumbered. The correspondence between the line numbers of the assignments of FIG. 5A and the line numbers of the assignments of FIG. 5B is maintained by the Instrumented to Non-instrumented sub-file of the Instrumentation Mapping Files 111. This Instrumented to Non-instrumented sub-file is shown in FIG. 5C. The left column shows the line numbers of the assignment statements in FIG. 5A, while the right column shows their corresponding line number in FIG. 5B.

FIG. 5D depicts the Expressions sub-file of Instrumentation Mapping Files 111 as generated by Instrumentation Process 102. As can be seen, the Expressions sub-file has six entries: one for each of the four synchronous assignment statements of FIG. 5B and one for each of the two asynchronous assignment statements of FIG. 5B. During the simulation of the code of FIG. 5B, by the HDL Simulation Process 104, the Expressions sub-file of FIG. 5D is utilized as follows.

The first action of HDL Simulation Process 104 is to issue a callback to the AASP process of Monitoring Process 106. The AASP processes the last two entries of FIG. 5D such that it produces the appropriate parameters for the callback functions of signals "a," "b," and "c." An exemplary form of the parameter, for each of these three callback functions, is shown in FIG. 5E. The AASP then returns control to HDL Simulation Process 104 and the simulation of Instrumented HDL Source Code 103 begins.

When the PLI call at line 30 is executed, the atomic function "$pli" is given the parameter "30." The atomic function searches the Expressions sub-file for all entries that have their PLI_call_instrumented_line_num field set to 30 and finds the first two entries. Each of these entries is processed in turn, and is described as follows.

For the first entry found, the only item of the rhs_expression field is "a & d." Given the current logical values for signals "a" and "d," at this point in the simulation, a subset of these two signals, that observably effects the result assigned to lhs signal, is determined. This subset is determined by applying the rule of Appendix A for the logical AND operator (referred to in Verilog HDL by the symbol "&"). Assuming that signal "e" is not a directly observable signal: i) the tag value computed is assigned to signal "e" as directed by the value of field lhs-_signal, and ii) the tag value assigned to signal "e" is also written to the Blocked Tags File. Assuming that signal "e" is a directly observable signal: i) the tag value computed is not assigned to signal "e," and ii) each assignment statement indicated in the tag history of the tag value is "checked off" in the Observability Coverage data structure as having had an observable effect on an observable output.

A similar process is then performed for the second found entry in which the rhs_expression "b||h" is evaluated to produce a tag value that is then assigned to signal "f" as directed by field lhs_signal.

The net effect, therefore, is that the two entries of the Expressions sub-file (for the PLI call "$pli(30)") have caused Monitoring Process 106 to create and propagate the tag values associated with the Verilog HDL code that is about to be executed as part of the logical value simulation of the HDL Simulation Process 104.

When the PLI call at line 60 is executed, the atomic function "$pli" is given the parameter "60." The atomic function searches the Expressions sub-file for all entries that have their PLI_call_instrumented_line_num field set to 60 and finds one entry. As can be seen, the rhs_expression field of this entry is considerably more complex than that of the previous two entries considered. The rhs_expression field is a list comprised of three items. The first item is simply the data-flow expression of the rhs of the assignment statement. The next two items are the control-flow conditional expressions of the two "if" statements within which the assignment below the PLI call is nested. This list of items is iterated through. For each item, a subset of its signals, that are observably effecting the result of the assignment, is determined. This is accomplished by parsing the item and then applying the appropriate rules of Appendix A as part of a bottom-up parse tree walk described above in Section 2. All the subsets of all the items are unioned together and a copy of the tag value, for each member of the unioned set, is created. These tag value copies then all become children of the root tag value node created to form the new tag value assigned to the signal "e" as specified by the field lhs_signal.

When the PLI call at line 80 is executed, the atomic function "$pli" is given the parameter "80." The atomic function searches the Expressions sub-file for all entries that have their PLI_call_instrumented_line_num field set to 80 and finds one entry. The processing performed by the atomic function, in accordance with this entry, is very similar to the processing described above for the PLI call at line 60.

FIG. 5E can also be used to depict how the callback functions operate when a callback node, of an asynchronous assignment statement, changes value. For example, whenever signal "a" changes value, HDL Simulation Process 104 invokes a callback function with the first parameter specified in FIG. 5E. As can be seen, the first parameter of FIG. 5E is comprised of two entries, one for the assignment at line 10 and the other for the assignment at line 20. Since a callback is not invoked by an inserted textual PLI call, the field PLI_call_instrumented_line_num is not applicable and is indicated as empty by assigning the value 0. The processing of each assignment statement entry is the same as described above for synchronous assignment statements. When signal "b" changes value, only the assignment statement at line 10 is to be executed. Therefore, the second entry of FIG. 5E depicts the parameter passed to a callback function when a change in "b" occurs. Similarly, the last entry of FIG. 5E shows the callback function parameter, specifying tag value propagation just for assignment statement at line 20, when signal "c" changes.

Writing to the Blocked Tags File, if lhs_signal is not directly observable, or "checking off" the appropriate assignment statements in the Observability Coverage data structure, if lhs_signal is directly observable, is accomplished for asynchronous assignment statements in the same manner as discussed above for synchronous assignment statements.

FIG. 5F depicts an instance of a module "lower_mod" in a higher-level module "higher_mod." As can be seen in FIG. 5F the module definition "lower_mod" has ports named (from left to right) out1, in1 and in2; whereas instance "lower_mod_inst" interfaces with its containing module definition "higher_mod" with ports named z, x, and the expression "y & q." Signal "x" and each signal of the expression "y & q" are associated with a callback function. When, for example, the value of "x" changes, a callback function is called such that it propagates the tag value of "x" to the signal "lower_mod_inst.in1" within the module instance "lower_mod_inst." This is accomplished with a parameter in accordance with the third entry listed in FIG. 5H. As can be seen, both the "PLI_call_instrumented_line_num" and "assign_stmt_instrumented_line_num" fields of the entry have been set to zero since they are not applicable.

When either signal "y" or signal "q" changes, a callback function is called such that it propagates the tag value of the expression "y & q" to the signal "lower_mod_inst.in2" within the module instance "lower_mod_inst." This is accomplished by parameters in accordance with the first and second entries of FIG. 5H. When the signal "lower_mod_inst.out1" changes value, a callback function is called such that it propagates the tag value of lower_mod_inst.out1 to the signal "z" of the higher_mod module definition. This is accomplished by a parameter in accordance with the last entry of FIG. 5H.

As discussed above, it may be desirable to generate the first two entries of FIG. 5H in a different manner from the last two entries. Specifically, since the parameter "y & q" is comprised of more than one signal, Instrumentation Process 102 may generate an entry for it in the Expressions sub-file. Such entry is shown in FIG. 5G. As can be seen in FIG. 5G, this entry is given a value for its assign_stmt_instrumented_line_num field of 0, since the line number of 10, for the lower_mod_inst of FIG. 5F, is generally inapplicable for such non-assignment statements. This entry is then converted into the first two parameters of FIG. 5H by the AASP (as discussed above). The last two parameters of FIG. 5H are produced by the MAASP performing a search of the design hierarchy with standard PLI calls (as discussed above).

5. Post Processing

Once HDL Simulation Process 104 has completed processing Stimulus Vectors 101, the last tag values, associated with each signal set by an assignment statement, are all written to the Blocked Tags File by Monitoring Process 106.

Next, the Observability Coverage data structure and the Blocked Tags File are processed by Reporting Process 108 to produce an Observability Report 109. A variey of Observability Reports can be produced depending upon the particular needs of the circuit designer and of the circuit design project.

In general, as discussed above, the Observability Coverage data structure contains an entry for every assignment statement of HDL Source Code 100 whose lhs output signal is not directly observable. The entries are designated by the unique line number that has been assigned to each assignment statement for HDL Source Code 100.

Reporting Process 108 scans the Observability Coverage data structure to determine which assignment statements have not been "checked off" and have therefore not produced at least one observable output. For each of those unobserved assignment statements, its unique line number (which shall be referred to as "L") is used to search the Blocked Tags File.

Specifically, tag values whose tag ID, or whose tag history, contain the value L are located. Among the tag values found for a particular line number L, the objective is generally to locate those few tag values which represent furthest traversals along particular paths through the circuit design. Each such tag value, which represents a furthest traversal along a circuit path, shall be referred to as a "maximal traversal tag value." These maximal traversal tag values are useful since they provide information regarding fullest extent to which a value produced by an assignment L has traversed along a particular circuit path. For each such maximal traversal tag value, the assignment statement responsible for blocking L's further traversal is identified from its tag last used value.

6. Hardware Environment

Figure 6:
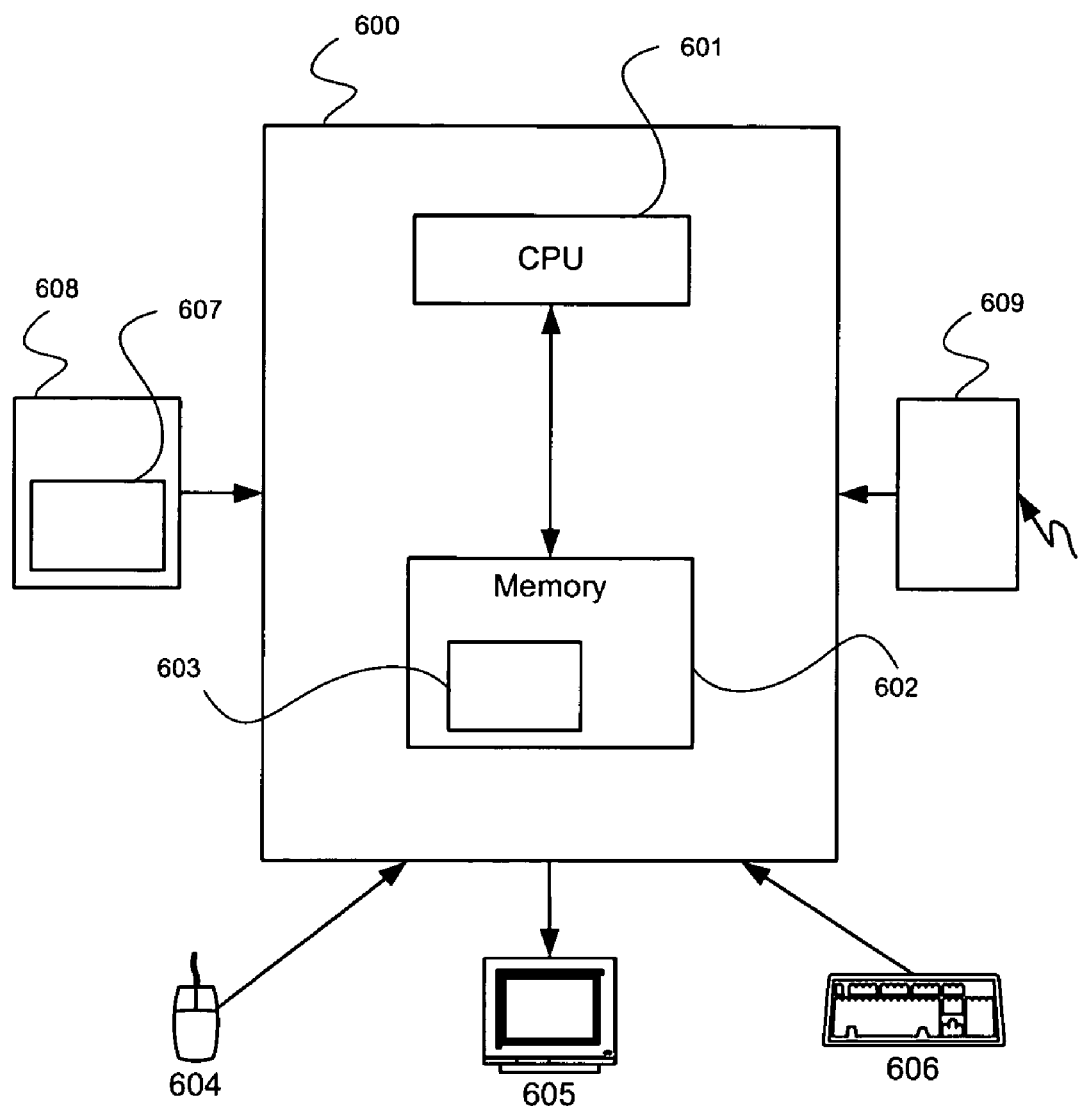
FIG. 6 depicts a hardware environment in which the present invention can be operated.

Typically, the coverage analysis architecture of the present invention is executed within the computing environment (or data processing system) such as that of FIG. 6. FIG. 6 depicts a workstation computer 600 comprising a Central Processing Unit (CPU) 601 (or other appropriate processor or processors) and a memory 602. Memory 602 has a portion of its memory in which is stored the software tools and data of the present invention. While memory 603 is depicted as a single region, those of ordinary skill in the art will appreciate that, in fact, such software may be distributed over several memory regions or several computers. Furthermore, depending upon the computer's memory organization (such as virtual memory), memory 602 may comprise several types of memory (including cache, random access memory, hard disk and networked file server). Computer 600 is typically equipped with a display monitor 605, a mouse pointing device 604 and a keyboard 606 to provide interactivity between the software of the present invention and the chip designer. Computer 600 also includes a way of reading computer readable instructions from a computer readable medium 607, via a medium reader 608, into the memory 602. Computer 600 also includes a way of reading computer readable instructions via the Internet (or other network) through network interface 609. The software tools and data of the present invention may be stored as computer readable instructions on a computer readable medium, such as 607. The software tools and data of the present invention may also be transported into a computer system over a network and through a network interface, such as 609. Such network transmission may involve the use of a carrier wave.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

Whereas the preferred embodiment of the present invention has been presented in terms of determining code coverage of an HLHDL, it is readily apparent to those of skill in the art that these techniques could be applied to other programming languages. For example, the present invention could be applied to the testing of programs which are not necessarily intended to specify hardware, but which specify algorithms for data processing. For the testing of such data processing programs it may be useful to know whether certain statements have had an "observable" effect. In this context, an "observable" output may mean, for example, a variable whose value is utilized as the program's output.

What is claimed is:

1. A method performed by a data processing system having a memory, comprising the steps of:
    simulating an execution of an assignment statement of a hardware description language design specification in order to determine a logical value for a target signal of the assignment statement based upon a set of logical values for a set of input signals to the assignment statement;
    identifying a subset of the input signals having an observably controllable effect on the logical value of the target signal based upon the logical values of the input signals and a functional interrelation of the input signals; and
    determining a target tag value for the target signal comprising an identifier of the assignment statement and a history comprised of a first tag value for an input signal that is a member of the subset of input signals, wherein the first tag value includes an identifier of a first assignment statement temporally earlier than the assignment statement.

2. The method of claim 1, wherein:
    the step of identifying further comprises identifying a second subset of a set of input signals to a conditional statement of the hardware description language design specification having an observably controllable effect upon whether the assignment statement is simulated, membership in the second subset being based upon a logical value for each of an input signal to the conditional statement and a functional interrelation of the input signals to the conditional statement; and
    the step of determining further comprises determining the history to be comprised of a tag value of a signal of the second subset.

3. The method of claim 2, wherein the history is comprised of a copy of a tag value of each input signal that is a member of the subset of input signals.

4. The method of claim 1, wherein:
    the step of identifying further comprises identifying a second subset of a set of input signals to a conditional expression of a conditional statement of the hardware description language design specification having an observably controllable effect upon whether the conditional expression is satisfied; and
    the step of determining further comprises determining the history to be comprised of a tag value of a signal of the second subset.

5. The method of claim 4, wherein the history is comprised of a copy of a tag value of each input signal that is a member of the subset of input signals.

6. The method of claim 1, wherein the history is comprised of a copy of a tag value of each input signal that is a member of the subset of input signals.

7. The method of claim 1, wherein:
the method further comprises the step of propagating the target tag value from the target signal, within a module instantiation comprising the assignment statement, to a higher-level signal of the hardware description language design specification.

8. The method of claim 7, wherein the step of propagating is performed in response to determining the logical value for the target signal.

9. The method of claim 7, wherein the target signal is defined as an output signal of the module instantiation.

10. The method of claim 7, wherein the propagation is performed by creating a copy of the target tag value.

11. The method of claim 1, wherein:
the method further comprises the step of propagating the target tag value from the target signal, at a higher-level than a module instantiation of the hardware description language design specification, to a lower-level signal of the module instantiation.

12. The method of claim 11, wherein the step of propagating is performed in response to determining the logical value for the target signal.

13. The method of claim 11, wherein the lower-level signal is defined as an input signal of the module instantiation.

14. The method of claim 11, wherein the propagation is performed by creating a copy of the target tag value.

15. The method of claim 1, wherein observable controllability of a first input signal is determined by determining whether a flipping of a first logical value of the first input signal will cause a flipping of the logical value of the target signal.

16. The method of claim 1, wherein observable controllability of a first intermediate output signal of a first sub-function, wherein the functional interrelation of the input signals is comprised of the first sub-function, is determined by a rule-based consideration of the first sub-function and of a logical value for each input of the first sub-function.

17. The method of claim 16, wherein a logical value of the first sub-function is the same logical value assigned to the target signal.

18. The method of claim 16, wherein an input signal of the first sub-function is an input signal of the assignment statement.

19. The method of claim 1, wherein the target tag value is further comprised of a field for indicating a subsequent assignment statement that utilizes the target tag value.

20. A data processing system having a memory, comprising the following:
a sub-system for simulating an execution of an assignment statement of a hardware description language design specification in order to determine a logical value for a target signal of the assignment statement based upon a set of logical values for a set of input signals to the assignment statement;
a sub-system for identifying a subset of the input signals having an observably controllable effect on the logical value of the target signal based upon the logical values of the input signals and a functional interrelation of the input signals; and
a sub-system for determining a target tag value for the target signal comprising an identifier of the assignment statement and a history comprised of a first tag value for an input signal that is a member of the subset of input signals, wherein the first tag value includes an identifier of a first assignment statement temporally earlier than the assignment statement.

21. A computer program product comprising:
a computer usable medium having computer readable code embodied therein;
computer readable program code devices configured to cause a computer to effect simulating an execution of an assignment statement of a hardware description language design specification in order to determine a logical value for a target signal of the assignment statement based upon a set of logical values for a set of input signals to the assignment statement;
computer readable program code devices configured to cause a computer to effect identifying a subset of the input signals having an observably controllable effect on the logical value of the target signal based upon the logical values of the input signals and a functional interrelation of the input signals; and
computer readable program code devices configured to cause a computer to effect determining a target tag value for the target signal comprising an identifier of the assignment statement and a history comprised of a first tag value for an input signal that is a member of the subset of input signals, wherein the first tag value includes an identifier of a first assignment statement temporally earlier than the assignment statement.

* * * * *